United States Patent
Wang

(10) Patent No.: US 12,387,779 B2
(45) Date of Patent: Aug. 12, 2025

(54) WORD-LINE DRIVE CIRCUIT, WORD-LINE DRIVER AND STORAGE DEVICE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 176 days.

(21) Appl. No.: 17/952,379

(22) Filed: Sep. 26, 2022

(65) Prior Publication Data

US 2023/0017400 A1    Jan. 19, 2023

Related U.S. Application Data

(63) Continuation of application No. PCT/CN2022/104750, filed on Jul. 8, 2022.

(30) Foreign Application Priority Data

Jun. 24, 2022   (CN) .......................... 202210731404.2

(51) Int. Cl.
*G11C 11/40* (2006.01)
*G11C 11/408* (2006.01)
(Continued)

(52) U.S. Cl.
CPC ...... *G11C 11/4085* (2013.01); *G11C 11/4094* (2013.01); *H03K 19/01721* (2013.01)

(58) Field of Classification Search
CPC ... G11C 11/4085; G11C 11/4094; G11C 8/08; G11C 11/4023; H03K 19/01721
See application file for complete search history.

(56) References Cited

U.S. PATENT DOCUMENTS

| | | |
|---|---|---|
| 5,896,344 A | 4/1999 | Kirsch |
| 6,222,789 B1 | 4/2001 | Cha |
| (Continued) | | |

FOREIGN PATENT DOCUMENTS

| | | |
|---|---|---|
| CN | 101119113 A | 2/2008 |
| CN | 101243518 A | 8/2008 |
| (Continued) | | |

OTHER PUBLICATIONS

Partial supplementary European Search Report in application No. 22793374.4, mailed on Mar. 6, 2024.
(Continued)

*Primary Examiner* — Xiaochun L Chen
(74) *Attorney, Agent, or Firm* — Syncoda LLC; Feng Ma

(57) ABSTRACT

A word-line drive circuit, a word-line driver and a storage device are provided. The word-line drive circuit includes at least two SWDs. Each SWD is connected to an MWL for providing an enable signal and a sub word line. The SWD includes a holding transistor. A first end and a second end of the holding transistor are respectively connected to different sub word lines, and a gate receives a second drive signal. The SWD is configured to provide a first drive signal to a selected sub word line in response to the first drive signal and the enable signal, the selected sub word line being a sub word line connected to the first end or second end of the holding transistor, and to conduct the first end and the second end of the holding transistor in response to the first drive signal, the enable signal and the second drive signal.

15 Claims, 10 Drawing Sheets

(51) Int. Cl.
*G11C 11/4094* (2006.01)
*H03K 19/017* (2006.01)

(56) References Cited

U.S. PATENT DOCUMENTS

| | | | |
|---|---|---|---|
| 10,008,256 B1 | 6/2018 | Kim | |
| 2007/0035986 A1 | 2/2007 | Houston | |
| 2008/0031060 A1 | 2/2008 | Choi et al. | |
| 2009/0103375 A1 | 4/2009 | Houston | |
| 2009/0316513 A1* | 12/2009 | Na | G11C 8/14 365/230.06 |
| 2011/0149675 A1 | 6/2011 | Chang et al. | |
| 2021/0057008 A1 | 2/2021 | Kim | |
| 2021/0193213 A1 | 6/2021 | Jeong et al. | |
| 2022/0068350 A1 | 3/2022 | Miyatake | |
| 2022/0068351 A1 | 3/2022 | Shirako et al. | |
| 2022/0093158 A1* | 3/2022 | Lee | G11C 11/4097 |
| 2022/0130460 A1 | 4/2022 | Yang | |
| 2022/0139443 A1 | 5/2022 | Kim | |
| 2022/0157960 A1 | 5/2022 | Cho et al. | |

FOREIGN PATENT DOCUMENTS

| | | |
|---|---|---|
| CN | 113012734 A | 6/2021 |
| CN | 112420094 B | 4/2022 |
| CN | 113178217 | 5/2022 |
| CN | 114496019 A | 5/2022 |
| CN | 114512486 A | 5/2022 |
| JP | H2024896 A | 1/1990 |
| JP | 2010009737 A | 1/2010 |
| KR | 20010055932 A | 7/2001 |
| TW | I588842 B | 6/2017 |

OTHER PUBLICATIONS

First Office Action of the Taiwanese application No. 111142790, issued on Sep. 18, 2023. 8 pages with English abstract.

JP first office action in application No. 2022-564085, mailed on Sep. 3, 2024.

* cited by examiner

WORD-LINE DRIVE CIRCUIT, WORD-LINE DRIVER AND STORAGE DEVICE

CROSS-REFERENCE TO RELATED APPLICATIONS

This is a continuation of International Patent Application No. PCT/CN2022/104750, filed on Jul. 8, 2022, which claims priority to Chinese Patent Application No. 202210731404.2, filed on Jun. 24, 2022. The disclosures of International Patent Application No. PCT/CN2022/104750 and Chinese Patent Application No. 202210731404.2 are hereby incorporated by reference in their entireties.

BACKGROUND

A memory is a common semiconductor structure. As the size of the semiconductor structure is continuously reduced, a greater number of memories may be incorporated onto a chip, thereby contributing to the increase of product capacity. In a Dynamic Random Access Memory (DRAM), it is necessary to write/read data to/from storage units by using word lines and bit lines, and to operate based on voltages applied to the word lines.

As the DRAM capacity is increased, the number of memory units connected to one word line is increased, and the distance between word lines is reduced, which may cause the problem of speed delay. In order to improve delay of a word-line voltage, one word line may be divided into multiple sub word lines, and each sub word line may be driven by using a sub word-line driver (SWD). The SWD may be arranged in a word-line drive circuit.

However, the layout area of current word-line drive circuits is large, thereby causing low integration of the memory.

SUMMARY

Embodiments of the disclosure relate to the field of semiconductors, and more particularly, to a word-line drive circuit, a word-line driver and a storage device.

Embodiments of the disclosure provide a word-line drive circuit, including at least two SWDs. Each of the SWDs is connected to a main word line (MWL) for providing an enable signal, and a sub word line. The SWD includes a holding transistor. A first end and a second end of the holding transistor are respectively connected to different sub word lines. A gate of the holding transistor receives a second drive signal. The SWD is configured to provide a first drive signal to a selected sub word line in response to the first drive signal and the enable signal, where the selected sub word line is a sub word line connected to the first end or the second end of the holding transistor, and to conduct the first end and the second end of the holding transistor in response to the first drive signal, the enable signal and the second drive signal.

In some embodiments, the same MWL is connected to at least two SWDs. The same MWL corresponds to at least two sub word lines. The two sub word lines connected to the first end and the second end of the holding transistor respectively correspond to the same MWL.

In some embodiments, the at least two SWDs are respectively connected to different MWLs. The different MWLs correspond to different sub word lines. The two sub word lines connected to the first end and the second end respectively correspond to the different MWLs.

In some embodiments, the holding transistor includes an N-type Metal Oxide Semiconductor (NMOS) transistor.

In some embodiments, the SWD includes: a pull-up transistor, having a gate connected to the MWL, a source receiving the first drive signal, and a drain connected to the sub word line and the first end or the second end of the holding transistor; and a pull-down transistor, having a gate connected to the MWL, a drain connected to the drain of the pull-up transistor, and a source receiving a third drive signal.

In some embodiments, the pull-up transistor includes a P-type Metal Oxide Semiconductor (PMOS) transistor, and the pull-down transistor includes an NMOS transistor.

Correspondingly, embodiments of the disclosure also provide a word-line driver, including a PMOS area, an NMOS area, first gates, and multiple second gates. The PMOS area includes multiple first active areas extending along a first direction, and each first active area includes a first channel area and a first source area and a first drain area respectively located at two opposite sides of the first channel area. The NMOS area is arranged along a second direction with the PMOS area and includes multiple second active areas extending along the first direction. Each second active area includes a second channel area and a second source area and a second drain area respectively located at two opposite sides of the second channel area, and further includes a third channel area and a third source area and a third drain area respectively located at two opposite sides of the third channel area. Each of the first gates extends along the second direction and covers the multiple first channel areas and the multiple second channel areas. The first gate is electrically connected to a MWL. The first gates, the first source areas and the first drain areas constitute pull-up transistors, and the first gates, the second source areas and the second drain areas constitute pull-down transistors. Each of the second gates covers a corresponding third channel area, and the second gates, the third source areas and the third drain areas constitute holding transistors. A first drain area of one of the pull-up transistors is electrically connected to a second drain area of one of the pull-down transistors, and is electrically connected to a corresponding sub word line. A third drain area of the same holding transistor is electrically connected to the second drain area of one of the pull-down transistors, and a third source area is electrically connected to a second drain area of another pull-down transistor.

In some embodiments, each of the first gates includes: at least two extending portions spaced apart in the first direction and connection portions. The extending portions extend along the second direction and cover the multiple first channel areas and the multiple second channel areas. The connection portions connect the extending portions arranged adjacently in the first direction.

In some embodiments, the connection portions cover an area between the adjacent first active areas and also cover an area between the first active area and the second active area.

In some embodiments, a distance between adjacent extension portions of the NMOS area is greater than a distance between adjacent extension portions of part of the PMOS area in the first direction, and each second gate is located between the adjacent extension portions.

In some embodiments, the PMOS area includes a first PMOS area and a second PMOS area arranged along the second direction. The second PMOS area is located between the first PMOS area and the NMOS area. Two extension portions of the same first gate cover the same first active area of the first PMOS area, and the two extension portions also respectively cover two first active areas of the second PMOS area which are arranged along the first direction. A distance between adjacent extension portions of the first PMOS area is smaller than a distance between adjacent extension portions of the second PMOS area in the first direction.

In some embodiments, a distance between adjacent extension portions of the NMOS area is smaller than a distance between adjacent extension portions of part the PMOS area in the first direction, and each second gate is located outside an area surrounded by two of the extension portions.

In some embodiments, the PMOS area includes a first PMOS area and a second PMOS area arranged along the second direction. The second PMOS area is located between the first PMOS area and the NMOS area. The two extension portions of the same first gate cover the same first active area of the second PMOS area, and the two extension portions also respectively cover the two first active areas of the first PMOS area which are arranged along the first direction. A distance between the adjacent extension portions of the first PMOS area is greater than a distance between the adjacent extension portions of the second PMOS area in the first direction.

In some embodiments, the third channel area and at least one of the second channel areas belong to the same second active area.

In some embodiments, a second drain area of one of the pull-down transistors corresponding to the same first gate is shared with a third drain area of a holding transistor, and a second drain area of another pull-down transistor corresponding to the same first gate is shared with a third source area of the same holding transistor.

In some embodiments, the second drain area of one of the pull-down transistors corresponding to one of the first gates is shared with the third drain area of the holding transistor, and the second drain area of one of the pull-down transistors corresponding to another first gate is shared with the third source area of the same holding transistor.

In some embodiments, each of the first gates covers 4×N first channel areas and 4×N second channel areas, and the pull-up transistors and the pull-down transistors constituted by each of the first gates are electrically connected to 2×N holding transistors. N is a positive integer greater than or equal to 1.

In some embodiments, the multiple first active areas include at least two of the first active areas arranged close to the NMOS area. Two of the first active areas are spaced apart along the first direction and have a spaced area, and the second gate directly faces the spaced area in the second direction.

Correspondingly, the embodiments of the disclosure also provide a storage device. The storage device includes: a storage unit array including multiple storage units connected to multiple sub word lines and multiple bit lines; and the word-line drive circuit provided in any of the above embodiments; or, the word-line driver provided in any of the above embodiments.

In the technical solution of the word-line drive circuit provided by the embodiments of the disclosure, at least two SWDs are included. Each SWD is connected to a MWL and a sub word line, so that the SWD may drive the sub word line based on an enable signal received by the MWL. The SWD includes a holding transistor, and a first end and a second end of the holding transistor are respectively connected to different sub word lines. That is, two sub word lines share the same holding transistor. The SWD may drive the sub word line connected to one end of the holding transistor in response to a first drive signal and the enable signal, and the holding transistor may also keep the sub word line connected to the other end of the holding transistor in an unselected state based on the first drive signal, the enable signal and a second drive signal. That is, two sub word lines may be arranged to share a holding transistor so that, while one sub word line connected to one end of the holding transistor is driven, another sub word line connected to the other end of the holding transistor is in an unselected state. Thus, the area occupied by the word-line drive circuit can be reduced while keeping the performance of the word-line drive circuit unchanged, so that the layout area of the word-line drive circuit can be reduced.

BRIEF DESCRIPTION OF THE DRAWINGS

The one or more embodiments are illustrated exemplarily through the figures in the accompanying drawings, which do not form any limitation to the embodiments, and the figures in the drawings are not to scale unless specifically stated. In order to more clearly illustrate the technical solution in the embodiments of the disclosure or the conventional art, the drawings to be used in the embodiments will be briefly described below. It is apparent that the drawings in the following description are merely some embodiments of the disclosure. Other drawings may be obtained from those of ordinary skill in the art according to these drawings without any creative work.

DETAILED DESCRIPTION

Figure 1:
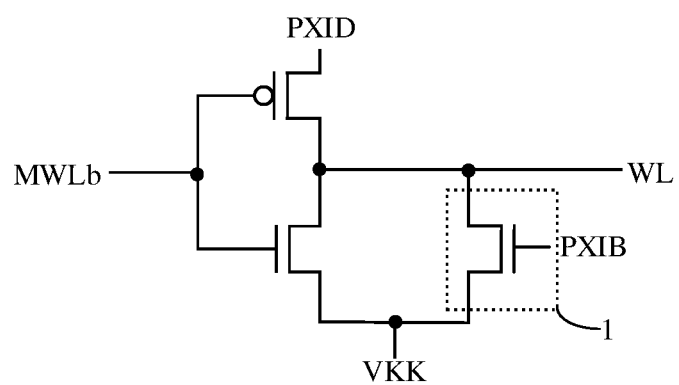
FIG. 1 is a circuit diagram of a word-line drive circuit.
Figure 2:
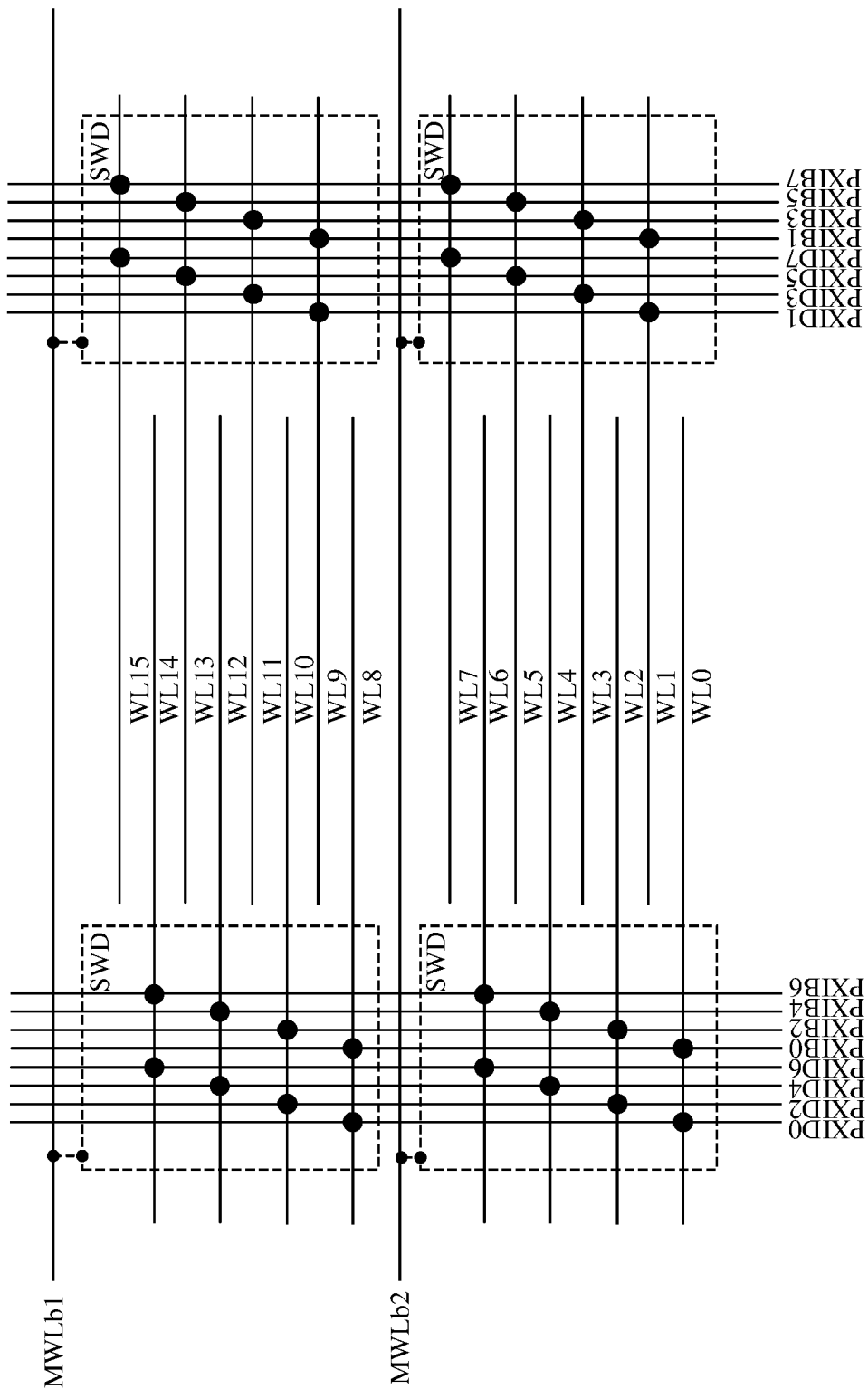
FIG. 2 is an architecture diagram of a sub word line system.

It can be seen from the BACKGROUND that the layout area of current word-line drive circuits is large. It is found through analysis that one of the reasons for the large layout area of the current word-line driver circuits is that, with reference to FIGS. 1 and 2, the current word-line drive circuit includes at least one SWD connected to a main word line (MWL) MWLb and a sub word line WL. The SWD further includes a holding transistor 1. A first end of the holding transistor 1 is connected to the sub word line WL, and the other end is coupled to a low level VKK. The SWD receives an enable signal and a drive signal PXID, and provides the drive signal PXID to the sub word line WL so as to drive the sub word line WL. When the sub word line WL does not need to be selected, the first end and the second end of the holding transistor 1 may be conducted in response to the enable signal, the drive signal PXID and a drive signal PXIB, so that the first end of the holding transistor 1 is coupled to the low level VKK, and the sub word line WL connected to the first end of the holding transistor 1 is also pulled down to the low level VKK, so that the sub word line WL is turned off. That is to say, one holding transistor is used to control only one sub word line, to keep the sub word line unselected. With reference to FIG. 2, it can be seen that when there are two MWLs, denoted as MWLb1 and MWLb2, in a word-line drive circuit, and each MWL corresponds to two SWDs, each holding transistor is electrically connected to one sub word line (multiple sub word lines are respectively denoted as WL0 to WL15 in FIG. 2), so that the SWDs respond to the corresponding drive signals PXIB and drive signals PXID, to control the turn-off of the sub word lines. This may occupy more space in the layout of the word-line drive circuit.

Embodiments of the disclosure provide a word-line drive circuit, a word-line driver and a storage device. The word-line drive circuit includes at least two word-line drivers, and each word-line driver is connected to an MWL and a sub word line. A first end and a second end of a holding transistor in each SWD are respectively connected to two sub word lines. That is, the two sub word lines share the same holding transistor. When the sub word line connected to one end of the holding transistor is driven, the holding transistor enables the sub word line connected to the other end of the holding transistor to be in an unselected state. Thus, the area occupied by the word-line drive circuit can be reduced while keeping the performance of the word-line drive circuit unchanged, and the layout area of the word-line drive circuit is reduced.

The various embodiments of the disclosure will be illustrated below in combination with the accompanying drawings. However, it will be appreciated by those of ordinary skill in the art that in the embodiments of the disclosure, numerous specific details are set forth in order to provide a better understanding of the disclosure for the reader. However, the claimed technical solutions of the disclosure may be realized without these technical details and various changes and modifications based on the following embodiments.

Figure 3:
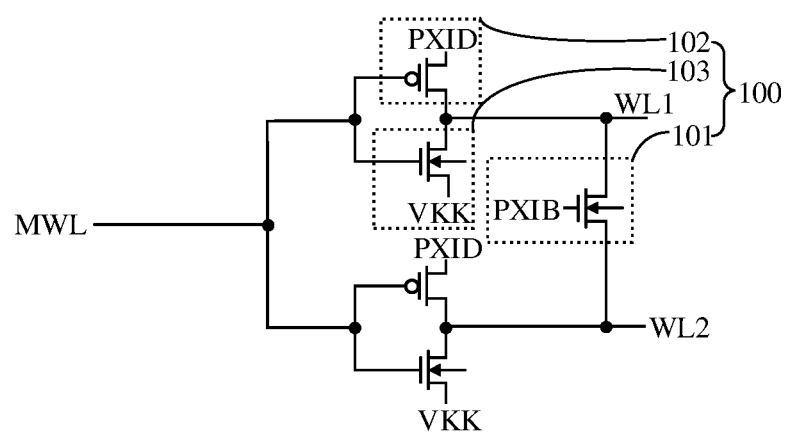
FIG. 3 is a circuit diagram of a word-line drive circuit according to an embodiment of the disclosure.

FIG. 3 is a circuit diagram of a word-line drive circuit according to an embodiment of the disclosure.

Referring to FIGS. 3 to 6, the word-line drive circuit includes at least two SWDs 100. Each of the SWDs 100 is connected to a MWL for providing an enable signal, and a sub word line. The SWD 100 includes a holding transistor 101. A first end and a second end of the holding transistor 101 are respectively connected to different sub word lines. A gate of the holding transistor 101 receives a second drive signal PXIB. The SWD 100 is configured to provide a first drive signal PXID to a selected sub word line in response to the first drive signal PXID and the enable signal. The selected sub word line is a sub word line connected to the first end or the second end of the holding transistor 101. The first end and the second end of the holding transistor 101 are conducted in response to the first drive signal PXID, the enable signal and the second drive signal PXIB.

The first end and the second end of the holding transistor 101 are provided to be respectively connected to two different sub word lines. That is, the two sub word lines share the same holding transistor 101. When each word-line driver responds to the first drive signal PXID and the enable signal, the first drive signal PXID is provided to a selected sub word line, so that the sub word line connected to the first end or the second end of the holding transistor 101 is selected, while another sub word line connected to the holding transistor 101 is not selected. When the word-line driver responds to the first drive signal PXID, the enable signal and the second drive signal PXIB, the first end and the second end of the holding transistor 101 are conducted, so that the level of the selected sub word line is pulled to be consistent with the level of the unselected sub word line, to turn off the selected word line. That is, when the sub word line connected to one end of the holding transistor 101 is driven, the holding transistor 101 enables the sub word line connected to the other end of the holding transistor 101 to be in an unselected state. Thus, the area occupied by the word-line drive circuit can be reduced while keeping the performance of the word-line drive circuit unchanged, and the layout area of the word-line drive circuit is reduced.

Figure 4:
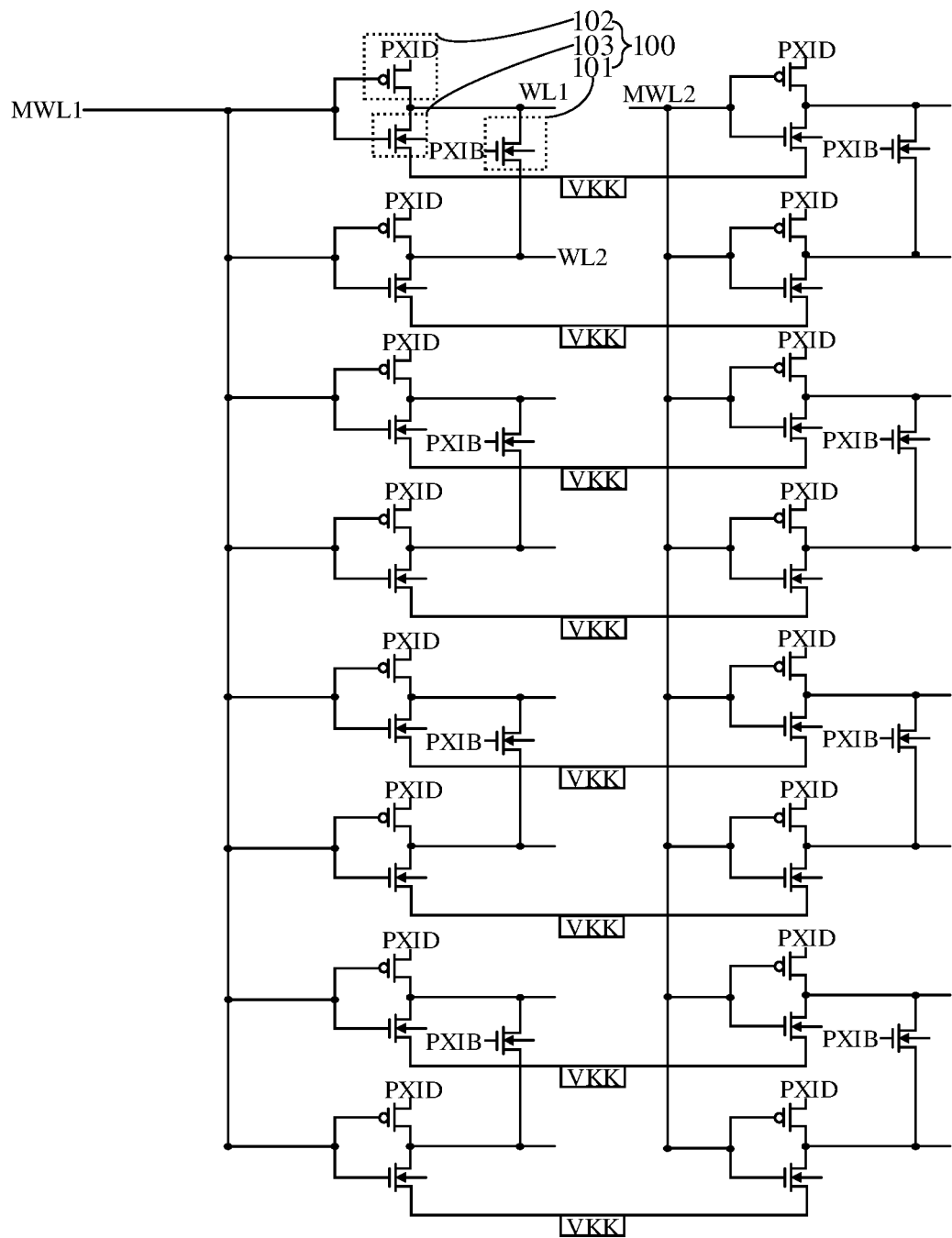
FIG. 4 is a circuit diagram of another word-line drive circuit according to an embodiment of the disclosure.

Referring to FIGS. 3 and 4, in some embodiments, the same MWL is connected to at least two SWDs 100. The same MWL corresponds to at least two sub word lines. The two sub word lines connected to the first end and the second end of the holding transistor respectively correspond to the same MWL. That is, the enable signal provided by the same MWL may be used to drive corresponding multiple sub word lines. As shown in FIG. 4, one MWL may be connected to eight SWDs 100, one MWL corresponds to eight sub word lines, and one MWL corresponds to only four holding transistors 101. That is, one MWL may share four holding transistors 101. When there are two MWLs, a total of 16 sub word lines may be driven, and the number of holding transistors 101 only needs to be 8. The area occupied by the SWD 100 is greatly reduced compared to the case that one MWL corresponds to eight holding transistors 101, so that the layout area of the word-line drive circuit can be greatly reduced.

Figure 5:
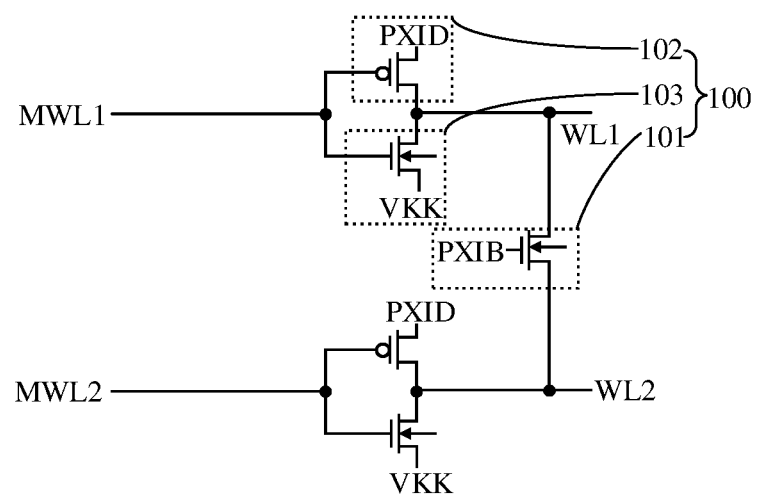
FIG. 5 is a circuit diagram of another word-line drive circuit according to an embodiment of the disclosure.
Figure 6:
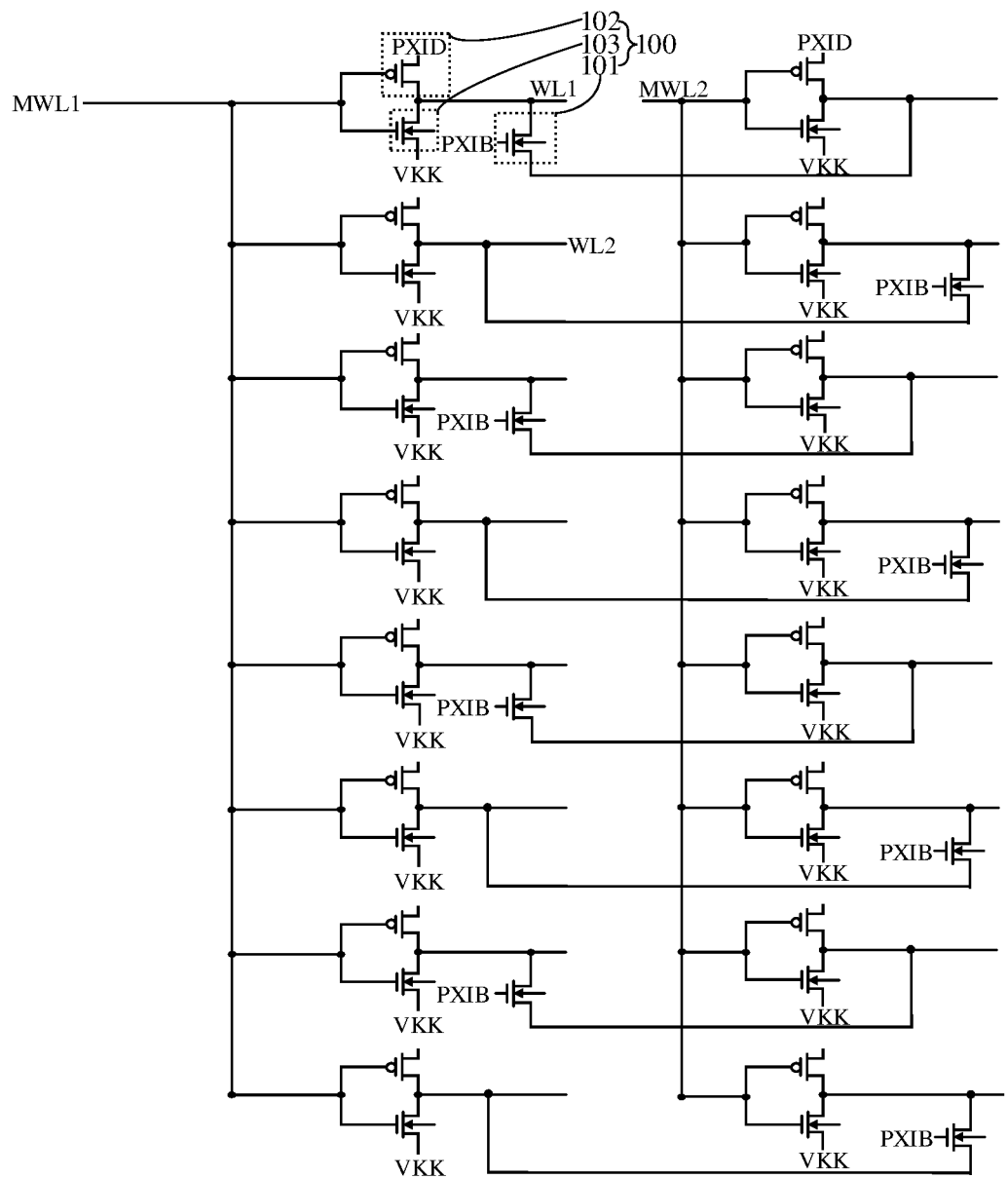
FIG. 6 is a circuit diagram of another word-line drive circuit according to an embodiment of the disclosure.

Referring to FIGS. 5 and 6, in other embodiments, at least two MWL drivers are respectively connected to different MWLs. The different MWLs correspond to different sub word lines. The two sub word lines connected to the first end and the second end of the holding transistor respectively correspond to the different MWLs. As shown in FIG. 6, the number of MWLs may be two. Each MWL is connected to eight SWDs 100, respectively. One MWL corresponds to eight holding transistors 101. Two SWDs 100 connected to different MWLs share the same holding transistor 101, so that the two MWLs share eight holding transistors 101. That is to say, a total of 16 sub word lines may be driven by two MWLs, and the number of holding transistors 101 is still 8, so that the number of holding transistors 101 in the SWDs 100 can be reduced, and the layout area of the word-line drive circuit can be reduced.

It can be understood that regardless of the number of SWDs 100 to which one MWL is connected and regardless of whether one MWL shares four holding transistors 101 or two MWLs share eight holding transistors 101, only one sub word line may be driven at any one time in a word-line drive circuit, and the remaining sub word lines are all in an unselected state.

Each SWD 100 may activate or pre-charge a selected sub word line in response to an enable signal provided from the MWL and the first drive signal PXID and the second drive signal PXIB input to the SWD 100, and the enable signal, the first drive signal PXID and the second drive signal PXIB may be provided by an external circuit. In some embodiments, the first drive signal PXID may be a high-voltage level, and the SWD 100 may drive the sub word lines with a high voltage. Correspondingly, when the high-voltage level is used to drive the sub word lines, a low-voltage level may be used to turn off the sub word lines.

Referring to FIGS. 3 and 5, since an SWD 100 is connected to a sub word line, a holding transistor 101 is connected to two different sub word lines, respectively. Therefore, in the word-line drive circuit, the number of SWDs 100 is twice the number of holding transistors 101. That is, two sub word lines to which one holding transistor 101 is connected are also connected to two SWDs 100, respectively.

It should be noted that in the word-line drive circuit, when one of the word-line drivers drives a sub word line connected thereto, all the sub word lines connected to the remaining SWDs 100 are in an unselected state. That is, in the word-line drive circuit, only one sub word line may be selected at the same time. It can be seen therefrom that when the sub word line connected to one of the first end and the second end of the holding transistor 101 is selected, the sub word line connected to the other of the first end and the second end of the holding transistor 101 is in an unselected state. Thus, when the first end and the second end of the holding transistor 101 are conducted, the level of the sub word line connected to the first end of the holding transistor 101 is pulled to be consistent with the level of the sub word line connected to the second end of the holding transistor 101, so that the level of the selected sub word line may be pulled down to be consistent with the level of the unselected sub word line, to enable the selected sub word line to be in an off state.

In some embodiments, each holding transistor 101 includes a NMOS transistor. The second drive signal PXIB may be a high-level signal, and the holding transistor 101 is turned on in response to the high-level signal, so as to conduct the first end and the second end of the holding transistor 101. When the first end and the second end are conducted, the levels of the two sub word lines connected to the first end and the second end are consistent. Specifically, when the sub word line connected to the first end of the holding transistor 101 is selected, the sub word line connected to the second end of the holding transistor 101 is in an unselected state. If the sub word line is driven in response to the high-voltage level, a node at the first end of the holding transistor 101 is in the high-voltage level, and a node at the second end is in the low-voltage level. After the first end and the second end of the holding transistor 101 are conducted, the level of the node at the first end of the holding transistor 101 is pulled down to be consistent with the level of the node at the second end. That is, the node at the first end of the holding transistor 101 has a negative-voltage level, which is equivalent to pre-charging the sub word line connected to the first end of the holding transistor 101 with a negative voltage to ensure that the sub word line connected to the first end of the holding transistor is turned off.

It can be seen that in the embodiments of the disclosure, since the first end and the second end of the holding transistor 101 are respectively connected to two sub word lines, when the first end and the second end of the holding transistor 101 are conducted, the level of the node at the first end is consistent with the level of the node at the second end. That is, it is ensured that the voltage of the selected word line is consistent with that of the unselected word line, thereby ensuring that the selected word line may be turned off.

In some embodiments, each SWD 100 includes: a pull-up transistor 102, where a gate of the pull-up transistor 102 is connected to the MWL, a source receives the first drive signal PXID, a drain is connected to the sub word line and the first end or the second end of the holding transistor 101; and a pull-down transistor 103, where a gate of the pull-down transistor 103 is connected to the MWL, a drain is connected to the drain of the pull-up transistor 102, a source receives a third drive signal VKK. The pull-up transistor 102 pulls up the sub word line to the level of the first drive signal PXID in response to the enable signal and the first drive signal PXID, and the sub word line is driven in response to the first drive signal PXID. The pull-down transistor 103 pulls down the sub word line to the level of the third drive signal VKK in response to the enable signal, and the sub word line is turned off in response to the third drive signal VKK. In some embodiments, the first drive signal PXID may be a high level and the third drive signal VKK may be a low level. For example, the voltage of the third drive signal VKK may be 0 or less than 0.

Specifically, when the SWD 100 drives a sub word line, the gate of the pull-up transistor 102 turns on the pull-up transistor 102 in response to the enable signal, and the first drive signal PXID is transmitted from the source to the drain of the pull-up transistor 102. Since the drain of the pull-up transistor 102 is connected to the sub word line, the first drive signal PXID is transmitted from the drain of the pull-up transistor 102 to the sub word line, so that the level of the sub word line is pulled up to the level of the first drive signal PXID.

When the SWD 100 turns off the sub word line, the gate of the pull-down transistor 103 turns on the pull-down transistor 103 in response to the enable signal, the third drive signal VKK is transmitted from the source to the drain of the pull-down transistor 103, the drain of the pull-down transistor 103 is connected to the drain of the pull-up transistor 102, and the drain of the pull-up transistor 102 is connected to the sub word line, so that the third drive signal VKK is transmitted from the drain of the pull-down transistor 103 to the sub word line, so that the level of the sub word line is pulled down to the third drive signal VKK.

It should be noted that since the enable signal or the third drive signal VKK may be instable, or since the word-line drive circuit may be disturbed by an external noise, resulting in that the level of the sub word lines may not be less than 0, the sub word line may not be turned off completely by means of only the third drive signal VKK. However, in the embodiments of the disclosure, since the first end and the second end of the holding transistor 101 are arranged to be connected to two different sub word lines, when the first end and the second end of the holding transistor 101 are conducted, the voltage of the selected word line will be pulled down to be consistent with the voltage of the unselected word line. That is, the holding transistor 101 may be turned off by coupling the voltage of the selected word line to a negative-voltage level. Therefore, the unselected word lines may keep a stable voltage value regardless of the level change of the enable signal or the third drive signal VKK.

In some embodiments, the pull-up transistor 102 includes a PMOS transistor, and the pull-down transistor 103 includes a NMOS transistor. That is, the pull-up transistor 102 is turned on in response to a low-level signal, and the pull-down transistor 103 is turned on in response to a high-level signal, so that the pull-up transistor 102 and the pull-down transistor 103 may respectively control the drive and the turn-off of the sub word lines without mutual interference.

Specifically, when the pull-up transistor 102 is a PMOS transistor and the pull-down transistor 103 is a NMOS transistor, the operation principle of the word-line drive circuit is as follows.

The two SWDs 100 are denoted as a first SWD and a second SWD. The sub word line connected to the first end of the holding transistor 101 is denoted as the first sub word line WL1, and the sub word line connected to the second end of the holding transistor 101 is denoted as the second sub word line WL2. The first sub word line WL1 is connected to the first SWD, and the second sub word line WL2 is connected to the first SWD.

The first SWD drives the first sub word line WL1, and the second sub word line WL2 is in an unselected state.

The first SWD drives the first sub word line WL1 in response to the enable signal in a low level, the first drive signal PXID in a high level and the second drive signal PXIB in a low level. Specifically, the pull-up transistor 102 is turned on in response to the enable signal in a low level, and the first drive signal PXID in a high level is transmitted from the source of the pull-up transistor 102 to the drain of the pull-up transistor 102, while the holding transistor 101 is turned off in response to the second drive signal PXIB in a low level, so that the level of the first sub word line WL1 is pulled up to the first drive signal PXID to be a high level, enabling the first sub word line WL1 to be driven.

The first SWD turns off the first sub word line WL1 in response to the enable signal in a high level, the first drive signal PXID in a low level, and the second drive signal PXIB in a high level. The pull-down transistor 103 is turned on in response to the enable signal in a high level, the pull-up transistor 102 is turned off in response to the enable signal in a high level, and the third drive signal VKK is transmitted from the source of the pull-down transistor 103 to the drain of the pull-down transistor 103, so that the level of the first sub word line WL1 is pulled down to the third drive signal VKK to be a low level. Meanwhile, the holding transistor 101 is turned on in response to the second drive signal PXIB in a high level, so that the level of the first sub word line WL1 is consistent with that of the second sub word line WL2. Since the second sub word line WL2 is in an unselected state, it can be ensured that the first sub word line WL1 is turned off to be in an unselected state.

The principle adopted for the second SWD to drive the second sub word line WL2 and turn off the sub word line is the same as the principle adopted for the second SWD, and will not be elaborated below. It should be noted that since the first SWD and the second SWD correspond to the same holding transistor 101, when the selected second sub word line WL2 needs to be turned off, the first end and the second end of the holding transistor 101 may be conducted to enable the level of the second sub word line WL2 to be pulled down to the level of the first sub word line WL1, so that the second sub word line WL2 is turned off. That is to say, one holding transistor 101 may be arranged to be connected to two different sub word lines, so as to control the turn-off of the two sub word lines.

Referring to FIG. 3, in some embodiments, the first SWD and the second SWD are connected to the same MWL. In such case, when the MWL inputs an enable signal, the gate of the pull-up transistor of the first SWD and the gate of the pull-up transistor 102 of the second SWD will simultaneously receive the enable signal from the MWL. Considering that only one sub word line may be driven, the level of the first drive signal PXID received by the source of the pull-up transistor 102 of the first SWD may be different from that received by the source of the pull-up transistor 102 of the second SWD to prevent the two sub word lines from being turned on at the same time.

Referring to FIG. 5, in some embodiments, the first SWD and the second SWD are respectively connected to different MWLs. For example, the first SWD is connected to the first MWL MWL1 and the second SWD is connected to the second MWL MWL2, so that the first SWD and the second SWD may respectively drive the connected sub word lines in response to an enable signal from the first MWL MWL1 and an enable signal from the second MWL MWL2.

Figure 7:
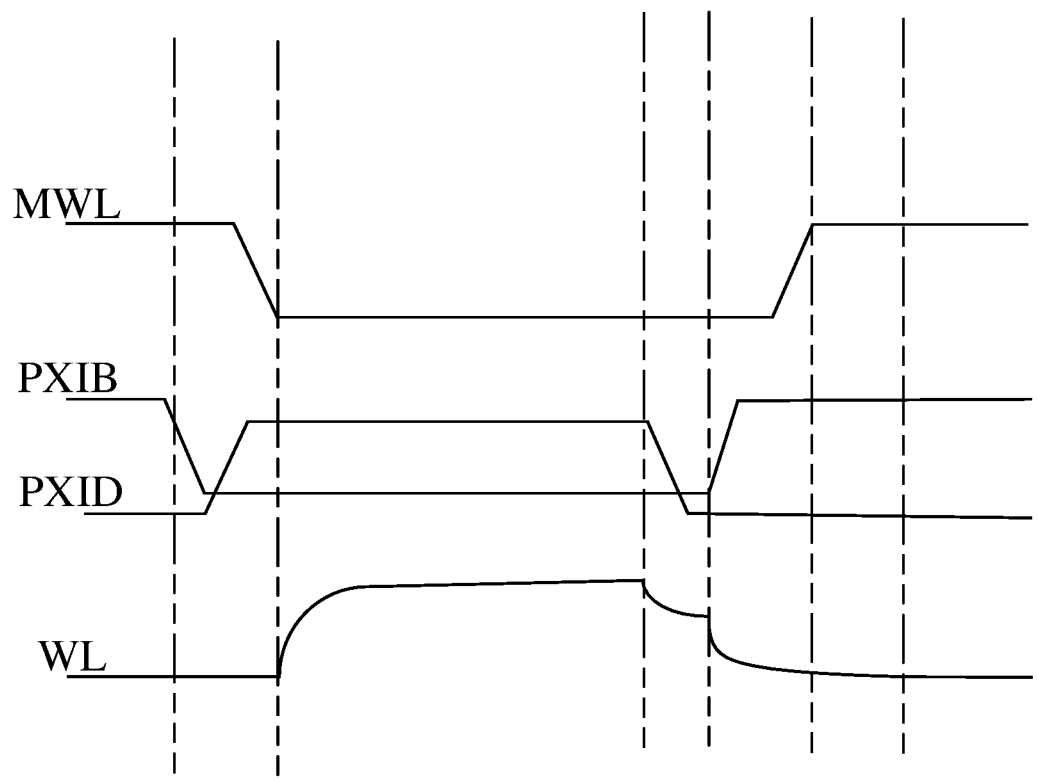
FIG. 7 is a timing diagram of various signals in a word-line drive circuit according to an embodiment of the disclosure.

Referring to FIG. 7, FIG. 7 is a timing diagram of various signals in a word-line drive circuit according to an embodiment of the disclosure.

When a sub word line is driven, the level of the first drive signal PXID is pulled up first. While the level of the first drive signal PXID is pulled up, the level of the second drive signal PXIB is pulled down, and then the level of the enable signal is pulled down, thereby driving the sub word line.

When the sub word line is turned off, the level of the first drive signal PXID is pulled down first. After the level of the first drive signal PXID is pulled down for a period of time, the level of the second drive signal PXIB is pulled up. That is, the time when the level of the second drive signal PXIB is pulled up is later than the time when the level of the first drive signal PXID is pulled down. And when the second drive signal PXIB is in a high level, the holding transistor is in an off state. Thus, the holding transistor may be kept off for a longer time, and the aging speed of the holding transistor can be reduced.

In the technical solutions of the word-line drive circuit provided by the above embodiments of the disclosure, the word-line drive circuit includes at least two SWDs, and each SWD is connected to a MWL and a sub word line. A first end and a second end of a holding transistor 101 in a SWD 100 are respectively connected to two sub word lines. That is, the two sub word lines share the same holding transistor 101. When the sub word line connected to one end of the holding transistor 101 is driven, the holding transistor 101 enables the sub word line connected to the other end of the holding transistor 101 to be in an unselected state. Thus, the area occupied by the word-line drive circuit can be reduced while keeping the performance of the word-line drive circuit unchanged, and the layout area of the word-line drive circuit is reduced.

Correspondingly, the embodiments of the disclosure also provide a word-line driver that may be used to form the word-line drive circuit provided by the above embodiments. The word-line driver provided by the embodiments of the disclosure will be described in detail below.

Figure 8:
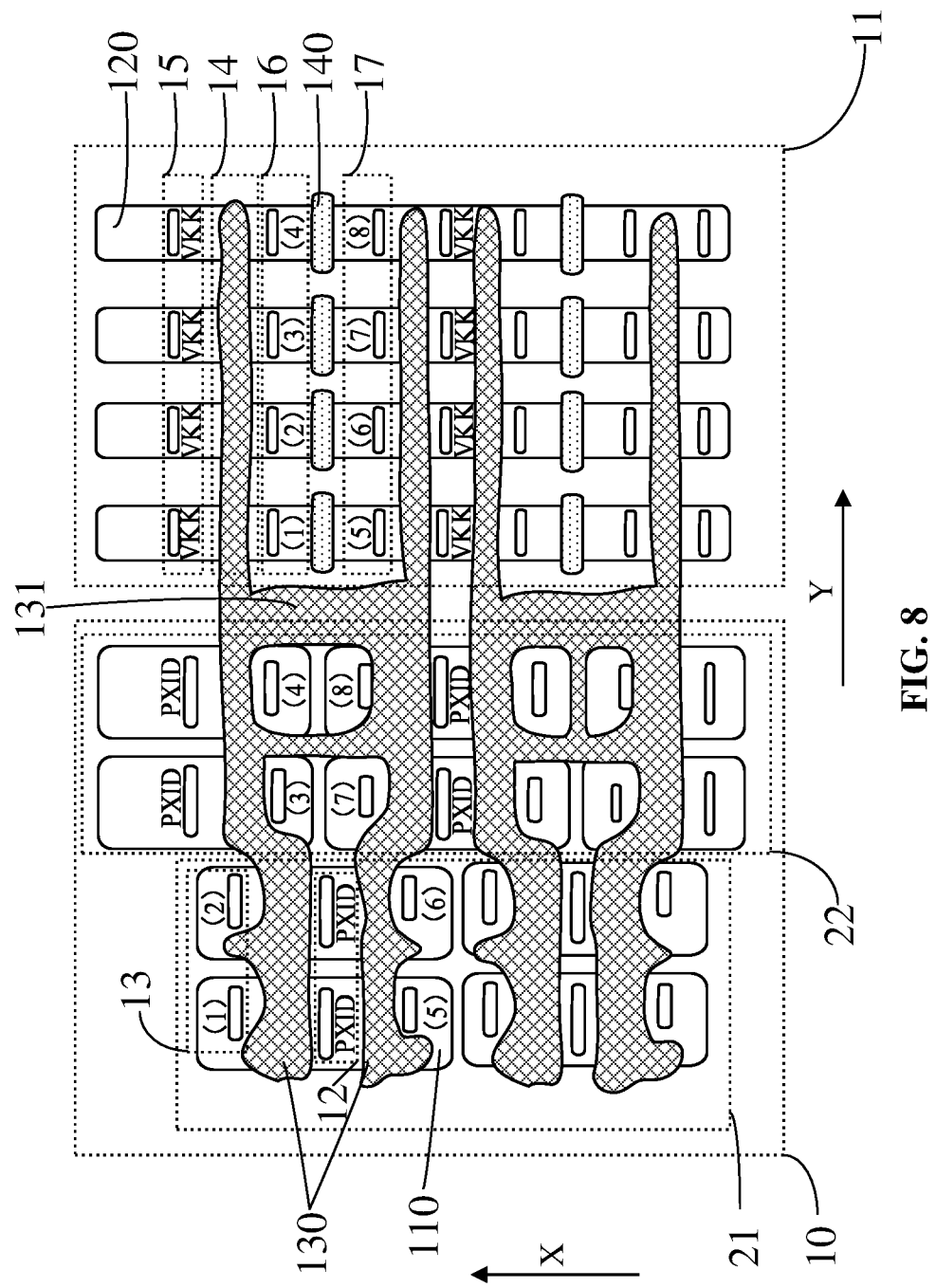
FIG. 8 is a schematic diagram of a layout structure of a first word-line driver according to an embodiment of the disclosure.

Referring to FIG. 8, the word-line driver includes a P-type Metal Oxide Semiconductor (PMOS) area 10, an N-type Metal Oxide Semiconductor (NMOS) area 11, first gates, and multiple second gates. The PMOS area 10 includes multiple first active areas 110 extending along a first direction X, and each first active area 110 includes a first channel area and a first source area 12 and a first drain area 13 respectively located at two opposite sides of the first channel area. The NMOS area 11 is arranged along a second direction Y with the PMOS area 10 and includes multiple second active areas 120 extending along the first direction X. Each second active area 120 includes a second channel area 14 and a second source area 15 and a second drain area 16 respectively located at two opposite sides of the second channel area 14, and the second active area 120 further includes a third channel area and a third source area 17 and a third drain area respectively located at two opposite sides of the third channel area. Each of the first gates 130 extends along the second direction Y and covers the multiple first channel areas and the multiple second channel areas 14. The first gate 130 is electrically connected to a MWL, the first gate 130, the first source area 12 and the first drain area 13 constitutes a pull-up transistor, the first gate 130, the second source area 15 and the second drain area 16 constitutes a pull-down transistor. Each of the second gates 140 covers the corresponding third channel area, and the second gate 140, the third source area 17 and the third drain area 14 constitutes a holding transistor. The first drain area 13 of one of the pull-up transistors is electrically connected to the second drain area 16 of the corresponding pull-down transistor, and is electrically connected to a corresponding sub word line. The third drain area of the same holding transistor is electrically connected to the second drain area 16 of one of the pull-down transistors, and the third source area 17 is electrically connected to the second drain area 16 of another pull-down transistor.

The PMOS area 10 is configured to form a PMOS transistor, the pull-up transistor is located in the PMOS area 10, that is, the pull-up transistor is a PMOS transistor. The NMOS area 11 is configured to form an NMOS transistor, and the pull-down transistor is located in the NMOS area 11, so that the pull-down transistor is an NMOS transistor. The first drain area 13 is configured to form a drain of the pull-up transistor, the second drain area 16 is configured to form a drain of the pull-down transistor, the first drain area 13 of the pull-up transistor 102 is electrically connected to the second drain area 16 of the pull-down transistor, and the first drain area 13 and the second drain area 16 are also respectively electrically connected to a sub word line. Thus, a drive signal for driving a sub word line may be transmitted to the drain of the pull-up transistor via the source of the pull-up transistor and input to the sub word line, to control the drive of the sub word line. A drive signal for turning off a sub word line may be transmitted to the drain of the pull-down transistor via the source of the pull-down transistor and input to the sub word line, to control the turn-off of the sub word line. And since the pull-up transistor and the pull-down transistor are different types of transistors, when the pull-up transistor is turned on, the pull-down transistor is turned off, so that the pull-up transistor may be configured to drive the sub word line. When the pull-down transistor is turned on, the pull-up transistor is turned off, so that the pull-down transistor may be configured to drive the sub word line. That is, the pull-up transistor and the pull-down transistor may be configured to drive and turn off the sub word line, respectively.

It will be appreciated that a pull-up transistor and a pull-down transistor may be configured to form a SWD for driving and turning off a sub word line. Since the pull-up transistor and the pull-down transistor are different types of transistors, the pull-up transistor is located in the PMOS area 10 and the pull-down transistor is located in the NMOS area 11, in some embodiments, a metal layer may also be included for electrically connecting the first drain area 13 of the pull-up transistor and the second drain area 16 of the pull-down transistor.

Referring to FIG. 8, in some embodiments, when the number of the first drain areas 13 is 8 and the number of the second drain areas 16 is 8, the first drain areas 13 in the PMOS area 10 are respectively marked as (1), (2), (3), (4), (5), (6), (7), and (8), and the second drain areas 16 in the NMOS area 11 are respectively marked as (1), (2), (3), (4), (5), (6), (7), and (8). When a metal layer is used to electrically connect the first drain area 13 and the second drain area 16, the metal layer may be provided to connect the first drain area 13 and the second drain area 16 having the same mark. For example, the metal layer may electrically connect the first drain area 13 marked as (1) in the PMOS area 10 and the second drain area 16 marked as (1) in the NMOS area 11. Thus, after multiple metal layers connect the first drain areas 13 and the second drain areas 16, the extension direction of the multiple metal layers is consistent. That is, the metal layers extend along the second direction Y, which is advantageous for simplifying the complexity of layout. In other embodiments, a metal layer may also be provided to connect the first drain area 13 and the second drain area 16 having different marks. For example, the metal layer may electrically connect the first drain area 13 marked as (1) in the PMOS area 10 and the second drain area 16 marked as (2) in the NMOS area 11, and the metal layer only needs to connect one first drain area 13 and one corresponding second drain area 16.

Specifically, in some embodiments, the metal layer may electrically connect the first drain area 13 and the second drain area 16 through a conductive plug.

Each first gate 130 may serve as a MWL, while serving as gates of multiple pull-up transistors and pull-down transistors, so that the multiple pull-up transistors and pull-down transistors may drive multiple sub word lines in response to the enable signal provided by the first gate 130.

The third drain area is used as a drain of the holding transistor, the third source area 17 is used as a source of the holding transistor, and the third source area 17 and the third drain area of the same holding transistor are respectively electrically connected to the second drain areas 16 of two different pull-down transistors. That is, the source and the drain of the same holding transistor are respectively connected to the drains of the two different pull-down transistors. Since the drains of the two different pull-down transistors are also connected to two different sub word lines, the source and the drain of the same holding transistor are also respectively electrically connected to the two different sub word lines, to enable one holding transistor to stabilize the voltages of the two different sub word lines. This is because the word-line driver may drive only one sub word line at the same time. For example, if the number of sub word lines is 2, when one of the sub word lines connected to the holding transistor is selected, the other sub word line is in an unselected state. When the selected sub word line needs to be turned off, the source and the drain of the holding transistor are conducted, so that the level of the selected sub word line is pulled to be consistent with the level of the unselected sub word line, thereby ensuring that the selected sub word line may be completely turned off.

In the embodiments of the disclosure, a source and a drain of one holding transistor are arranged to be electrically connected to two sub word lines, respectively, for controlling the two sub word lines, so that the number of holding transistors in the word-line driver is greatly reduced, and thus the layout area of the word-line driver can be reduced, as compared to the case where one holding transistor is configured to control one sub word line.

In some embodiments, each of the first gates 130 includes: at least two extending portions spaced apart in the first direction X and connection portions 131. The extending portions extend along the second direction Y and cover multiple first channel areas and multiple second channel areas 14. Each connection portion 131 connects the extending portions arranged adjacently in the first direction X. The two extension portions cover the multiple first channel areas and second channel areas 14, so that a first gate 130 is electrically connected to the multiple first channel areas and the multiple second channel areas 14 for controlling the turn-on of the multiple pull-up transistors and the pull-down transistors. Thus, the pull-up transistors and the pull-down transistors may be configured to drive and turn off the sub word lines, respectively. Each connection portion 131 connects the extension portions arranged adjacently in the first direction X, so that the two extension portions spaced apart are electrically connected to form a MWL for controlling the multiple pull-up transistors and pull-down transistors.

In some embodiments, the material of the first gate 130 may include at least one of polysilicon or metal.

In some embodiments, the connection portions 131 cover an area between the adjacent first active areas 110 and also cover an area between the first active area 110 and the second active area 120. As compared to the case where the connection portions 131 only cover the area between the adjacent first active areas 110, providing the connection portions 131 to cover the area between the first active area 110 and the second active area 120 at the same time allows an increase in the size of the connection portions 131, and thus the resistance of the connection portions 131 can be reduced, which is advantageous in reducing signal delay, thereby improving the performance of the word-line driver.

Specifically, in some embodiments, when the number of first active areas 110 is multiple, the connection portions 131 may cover an area between each adjacent first active area 110, or may cover only an area between two adjacent first active areas 110.

In other embodiments, the connection portion 131 may also cover only the area between the first active area 110 and the second active area 120. Thus, the process complexity can be reduced, and materials for forming the connection portion 131 can be saved.

Referring to FIG. 8, in some embodiments, a distance between the adjacent extension portions of the NMOS area 11 is greater than that between the adjacent extension portions of a part of the PMOS area 10 in the first direction X, and the second gate 140 is located between the adjacent extension portions. That is to say, the smaller distance between the adjacent extension portions of a part of the PMOS area 10 reduces the area occupied by the second gate 140, thereby advantageously reducing the layout area of the word-line driver. The extension portions on two sides of the second gate 140 may serve as gates of two different pull-up transistors, while the third drain area of the holding transistor and the third source area 17 of the holding transistor are electrically connected to second drain areas 16 of two different pull-down transistors, respectively. Therefore, when the second gate 140 is located between two extension portions, it is advantageous to form an electrical connection between the holding transistor and the second drain areas 16 of different pull-down transistors on two sides, thereby improving the rationality of layout.

The extension portions on two sides of the second gate 140 belong to the same first gate 130. That is to say, the same MWL is connected to two SWDs, and the two SWDs share the same holding transistor. That is, one MWL corresponds to only one holding transistor. Specifically, the corresponding circuit diagrams may be made reference to FIGS. 3 and 4. The same MWL is connected to at least two SWDs 100. The same MWL corresponds to at least two sub word lines. The two sub word lines connected to the first end and the second end of the holding transistor respectively correspond to the same MWL. When the number of SWDs 100 is 8, one MWL may be connected to eight SWDs 100, one MWL corresponds to eight sub word lines, and two sub word lines share one SWD 100. That is, one MWL corresponds to only four holding transistors 101. Thus, when the number of MWLs is two, 16 sub word lines may be driven, and only eight holding transistors 101 are needed, so that the layout area of the word-line driver can be greatly reduced.

Specifically, when the second gate 140 is located between two adjacent extension portions, the principle that the word-line driver drives the sub word line and turns off the sub word line may be as follows. Taking the first gates 130 as the gates of two pull-up transistors and the gates of two pull-down transistors as an example, the two pull-up transistors are respectively denoted as a first pull-up transistor and a second pull-up transistor, and the pull-down transistors are respectively denoted as a first pull-down transistor and a second pull-down transistor. The first pull-down transistor is electrically connected to the source of the holding transistor 101, and the second pull-down transistor is electrically connected to the drain of the holding transistor 101.

The principle of driving the sub word line to which the first pull-up transistor is connected is as follows. The first gate 130 inputs an enable signal, the gates of the first pull-up transistor and the second pull-up transistor are conducted in response to the enable signal, the holding transistor is turned off in response to the second drive signal PXIB in a low level, the source of the first pull-up transistor inputs the first drive signal PXID in a high level, and the source of the second pull-up transistor inputs the first drive signal PXID in a low level, so that the sub word line connected to the first pull-up transistor is driven with a high level, and the sub word line connected to the second pull-up transistor is turned off with a low level.

The principle of turning off the sub word line to which the first pull-up transistor is connected is as follows. The first gate 130 inputs an enable signal, the gates of the first pull-down transistor and the second pull-down transistor are conducted in response to the enable signal, the holding transistor is turned on in response to the second drive signal PXIB in a high level, and the source of the first pull-down transistor inputs the third drive signal VKK in a low level, so that the sub word line connected to the drain of the first pull-down transistor has a low level. Since the source and the drain of the holding transistor are respectively connected to different pull-down transistors, the level of the sub word line connected to the first pull-down transistor is pulled down to the level of the sub word line connected to the second pull-down transistor, so that the sub word line connected to the first pull-down transistor is turned off.

The processes of driving the sub word line connected to the second pull-down transistor and turning off the sub word line connected to the second pull-down transistor are the same as those described above, and will not be elaborated herein.

In some embodiments, each of the first gates 130 covers 4×N first channel areas and 4×N second channel areas 14, and the pull-up transistors and the pull-down transistors constituted by each of the first gates 130 are electrically connected to 2×N holding transistors, where N is a positive integer greater than or equal to 1. That is to say, the number of the first channel areas and the number of the second channel areas 14 are kept equal so that the number of pull-up transistors and the number of pull-down transistors are the same, and each of the pull-up transistors and the respective one of the pull-down transistors 103 constitutes one SWD. The number of holding transistors is half the number of pull-up transistors or pull-down transistors 103, so that two SWDs may share one holding transistor, thereby advantageously reducing the number of holding transistors in the word-line driver and thus reducing the layout area of the word-line driver.

Specifically, referring to FIGS. 8 and 4, in some embodiments, N is 2, and there are two extension portions. One of the extension portions covers four first channel areas, and one of the extension portions also covers four second channel areas 14. Based on this, the number of pull-up transistors 102 is 8, the number of pull-down transistors 103 is 8, and eight SWDs 100 are constituted. Each SWD 100 corresponds to one sub word line, and the number of holding transistors 101 is 4. That is, one holding transistor 101 is configured to control two sub word lines, so that one MWL formed by the first gate 130 is configured to control eight sub word lines, and two MWLs are configured to control 16 sub word lines when the number of first gates 130 is 2.

Figure 9:
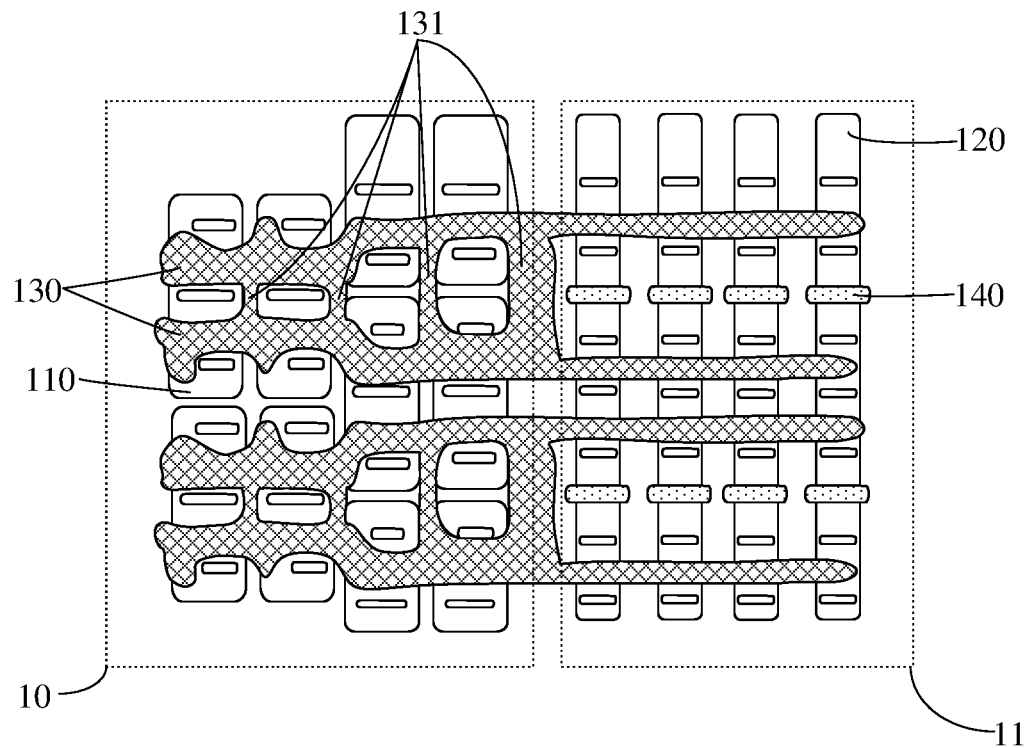
FIG. 9 is a schematic diagram of a layout structure of a second word-line driver according to an embodiment of the disclosure.

In other embodiments, referring to FIG. 9, N may be 3, and there are three extension portions. One of the extension portions covers four first channel areas, and one of the extension portions also covers four second channel areas 14. Based on this, the number of pull-up transistors is 12, the number of pull-down transistors is 12, and 12 SWDs are constituted. Each SWD corresponds to one sub word line, and the number of holding transistors is 6. That is, one holding transistor is configured to control two sub word lines, so that one MWL formed by the first gate 130 is configured to control 12 sub word lines, and two MWLs are configured to control 24 sub word lines when the number of first gates 130 is 2.

In some embodiments, the PMOS area 10 includes: a first PMOS area 21 and a second PMOS area 22 arranged along the second direction Y. The second PMOS area 22 is located between the first PMOS area 21 and the NMOS area 11. The two extension portions of the same first gate 130 cover the same first active area 110 of the first PMOS area 21, and the two extension portions also respectively cover the two first active areas 110 of the second PMOS area 22 which are arranged along the first direction X. A distance between the adjacent extension portions of the first PMOS area 21 is less than that between the adjacent extension portions of the second PMOS area 22 in the first direction X.

The two extension portions of the same first gate 130 cover the same first active area 110 of the first PMOS area 21, so that the formed two extension portions of the first gate 130 are electrically connected to the same first active area 110 of the first PMOS area 21, thereby forming two pull-up transistors. The two extension portions cover the two first active areas 110, arranged along the first direction X, of the second PMOS area 22, respectively, so that the two extension portions are electrically connected to the two first active areas 110, respectively, thereby forming two pull-up transistors. Since the two extension portions of the first gate 130 are located on the same active area, the distance between adjacent extension portions of the first PMOS area 21 is small, so that the area occupied by the first gate 130 can be reduced, thereby reducing the layout area.

Specifically, in some embodiments, in each first active area 110 of the first PMOS area 21, each extension portion covers a first channel area, and the first source area 12 is located between two first extension portions for inputting the first drive signal PXID. The first drain area 13 is located on a side of the channel area away from the first extension portion for constituting a pull-up transistor. There is one first source area 12 located between the two first extension portions, and the number of the first drain areas 13 may be 2. That is, two pull-up transistors share the same first source area 12, so as to improve the integration of the formed word-line driver and further reduce the layout area.

In each first active area 110 of the second PMOS area 22, each extension portion covers a first channel area, and the first source area 12 and the first drain area 13 are located on two sides of the first channel area. The first drain area 13 may be located between two extension portions, and the first source area 12 may also serve as a source of a pull-up transistor corresponding to another first gate 130. Thus, when there are multiple first gates 130, the size of the overall active area can be smaller, thereby making the layout area smaller.

Figure 10:
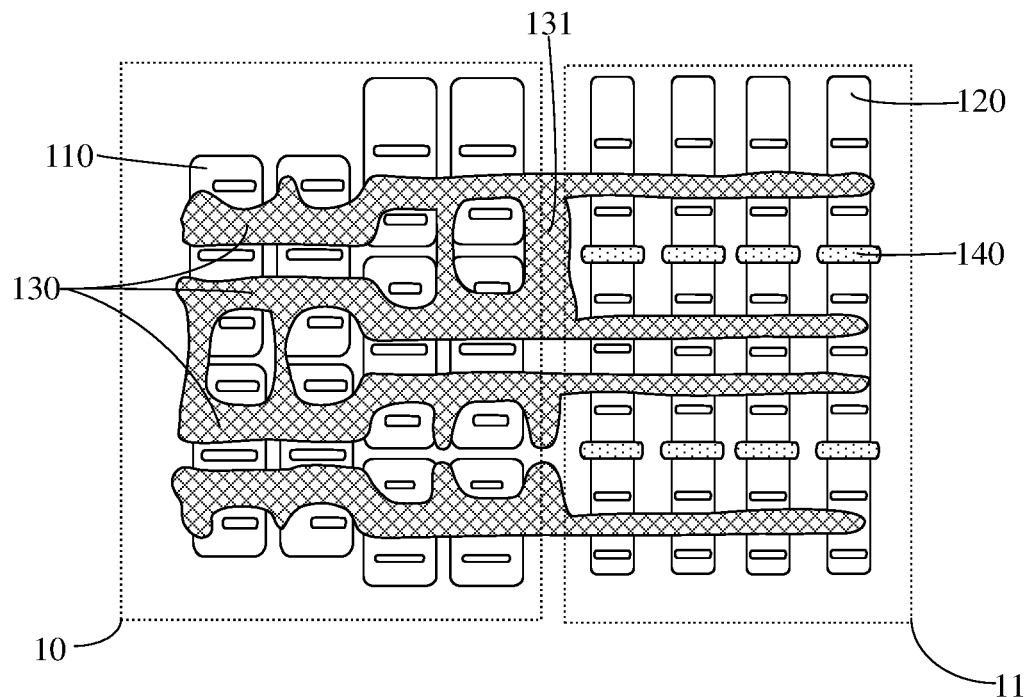
FIG. 10 is a schematic diagram of a layout structure of a third word-line driver according to an embodiment of the disclosure.

Referring to FIG. 10, in some embodiments, a distance between the adjacent extension portions of the NMOS area 11 is less than a distance between the adjacent extension portions of part of the PMOS area 10 in the first direction X, and the second gate 140 is located outside an area surrounded by two of the extension portions. Thus, when there are multiple first gates 130 spaced apart, the distance between the extension portions of different first gates 130 in the NMOS area 11 is large, thereby providing more space for forming the second gate 140. The extension portions on two sides of the second gate 140 are used as gates of two different pull-up transistors, respectively, and the extension portions on two sides of the second gate 140 belong to different first gates 130, so that the same holding transistor formed corresponds to different MWLs.

Corresponding circuit diagrams may be made reference to FIGS. 5 and 6. Two SWDs 100 connected to different MWLs share the same holding transistor 101. When the same MWL is connected to eight different SWDs 100, one MWL corresponds to eight holding transistors 101, and two MWLs share eight holding transistors 101. That is to say, a total of 16 sub word lines may be driven by two MWLs, and the number of holding transistors 101 is still 8, so that the number of holding transistors 101 in the SWDs 100 can be reduced, and the layout area of the word-line drive circuit can be reduced. When the SWDs 100 connected to two different MWLs drive the connected sub word lines, the connected sub word lines may be respectively driven in response to enable signals from the different MWLs.

In some embodiments, the PMOS area 10 includes: a first PMOS area 21 and a second PMOS area 22 arranged along the second direction Y. The second PMOS area 22 is located between the first PMOS area 21 and the NMOS area 11. The two extension portions of the same first gate 130 cover the same first active area 110 of the second PMOS area 22, and the two extension portions also respectively cover the two first active areas 110 of the first PMOS area 21 which are arranged along the first direction X. A distance between the adjacent extension portions of the first PMOS area 21 is greater than a distance between the adjacent extension portions of the second PMOS area 22 in the first direction X. That is, the distance between the two extension portions of the same first gate 130 in the direction along the first PMOS area 21 toward the second PMOS area 22 tends to be reduced. Since the distance between the two extension portions of the same first gate 130 is also smaller in the NMOS area 11 adjacent to the second PMOS area, orientation of the two extension portions located in the second PMOS area 22 may be similar to or the same as that of the two extension portions located in the NMOS area 11, thereby advantageously reducing the complexity of layout design.

Specifically, in each first active area 110 of the first PMOS area 21, each extension portion covers a first channel area, and the first source area 12 and the first drain area 13 are located on two sides of the first channel area. The first drain area 13 may be located between two extension portions, and the first source area 12 may also serve as a source of a pull-up transistor formed by another first gate 130. Thus, when there are multiple first gates 130, the size of the overall active area can be smaller, thereby making the layout area smaller.

In each first active area 110 of the second PMOS area 22, each extension portion covers a first channel area, and the first source area 12 is located between two first extension portions for inputting the first drive signal PXID. The first drain area 13 is located on a side of the channel area away from the first extension portion for constituting a pull-up transistor. There is one first source area 12 located between the two first extension portions, and the number of the first drain areas 13 may be 2. That is, two pull-up transistors share the same first source area 12, so as to improve the integration of the formed word-line driver and further reduce the layout area.

Referring to FIG. 10, in some embodiments, there is a connection portion 131 between two extension portions of the same first gate 130. The connection portions 131 are located between two adjacent first active areas 110 in the second PMOS area 22, and also between the adjacent first and second active areas 110 and 120. Thus, not only the size of the first gate 130 can be increased, but also the length of the connection portions 131 can be smaller due to the small distance between two adjacent extension portions in the second PMOS area 22, and thus the delay can be reduced when an electric signal is transmitted via the connection portions 131.

Figure 11:
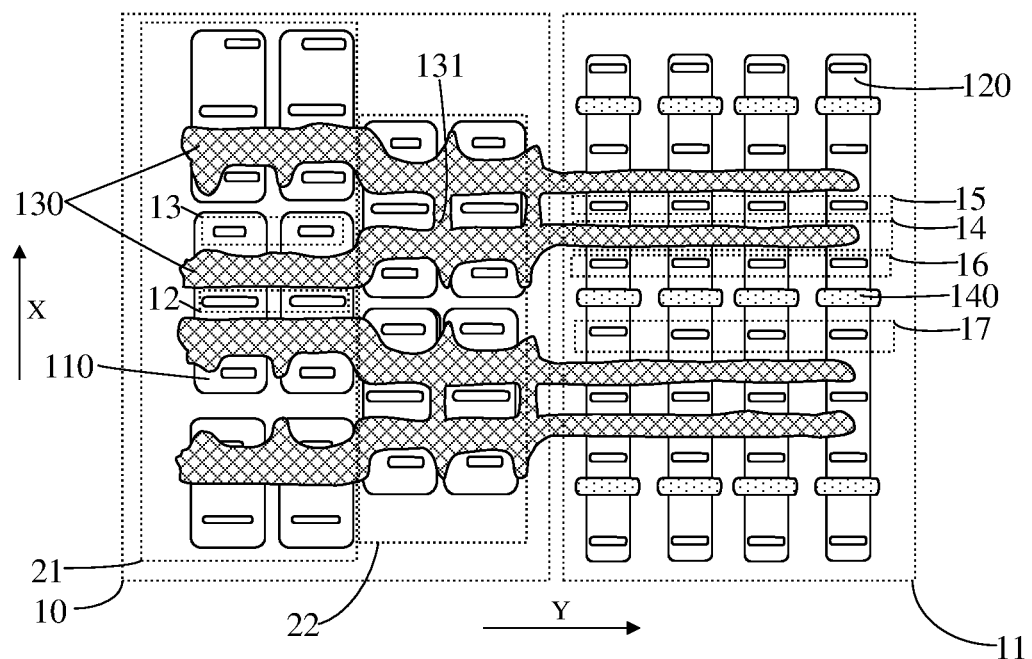
FIG. 11 is a schematic diagram of a layout structure of a fourth word-line driver according to an embodiment of the disclosure.
Figure 12:
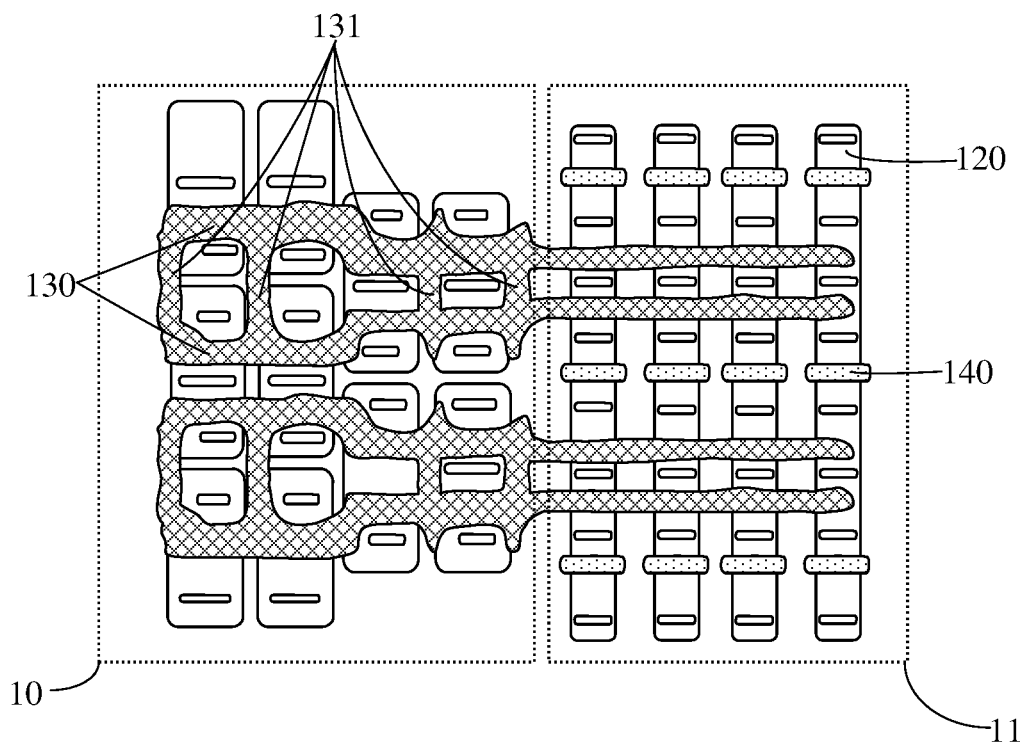
FIG. 12 is a schematic diagram of a layout structure of a fifth word-line driver according to an embodiment of the disclosure.

Referring to FIG. 11, in other embodiments, the connection portions 131 may also be located between two adjacent first active areas 110 in the first PMOS area 21, which may further increase the size of the first gate 130, thereby reducing the resistance of the first gate 130 and advantageously improving the transmission of the electric signal.

In some embodiments, the third channel area and at least one of the second channel areas 14 belong to the same second active area 120. The third channel area and the second channel area 14 are both located in the NMOS area 11. That is, a doping ion type in the second active area 120 corresponding to the third channel area is the same as a doping ion type in the second active area 120 corresponding to the second channel area 14. Therefore, the third channel area and the second channel area 14 are arranged to share the same second active area 120, which is not only beneficial to simplify the processing, but also can save the space of the second active area 120, thereby improving the integration of the layout structure of the word-line driver and reducing the area of the layout structure.

Specifically, referring to FIG. 8, in some embodiments, when the second gate 140 is located between adjacent extension portions of the same first gate 130, the second drain area 16 of one of the pull-down transistors corresponding to the same first gate 130 is shared with the third drain area of the holding transistor, and the second drain area 16 of another pull-down transistor corresponding to the same first gate 130 is shared with the third source area 17 of the same holding transistor. The second gate 140 covers the surface of the third channel area, so that the formed second gate 140 is electrically connected to the third channel area, the second gate 140 serves as the gate of the holding transistor, and the third drain area and the third source area 17 on two sides of the third channel area serve as the drain and the source of the holding transistor. The two extension portions on two sides of the second gate 140 serve as gates of two different pull-down transistors, respectively, for providing the third drive signal VKK. The third drain area may serve as the drain of one of the pull-down transistors, and the third source area 17 may serve as the drain of another pull-down transistor. The second source areas 15 of the two pull-down transistors are located on a side of the extension portion away from the second gate for serving as sources of the pull-down transistors. In some embodiments, the second source area 15 may also serve as the source of the pull-down transistor corresponding to another first gate 130. That is to say, the second drain area 16 of the same pull-down transistor is shared with the third drain area of the holding transistor, and the second source area 15 is shared with the second source area 15 of the pull-down transistor corresponding to another first gate 130, so that the occupied area of the second active area 120 can be greatly reduced, thereby improving the integration of the word-line driver.

Referring to FIG. 10, in other embodiments, when the second gate 140 is located outside the area surrounded by two extension portions, i.e., the second gate 140 is located between two adjacent first gates 130, the second drain area 16 of one of the pull-down transistors 103 corresponding to one of the first gates 130 is shared with the third drain area of the holding transistor 101, and the second drain area 16 of one of the pull-down transistors 103 corresponding to another first gate 130 is shared with the third source area 17 of the same holding transistor 101. The two extension portions located on two sides of the second gate 140 respectively belong to different first gates 130 for forming different pull-down transistors. That is, the holding transistors are electrically connected to pull-down transistors corresponding to two different first gates 130. The third drain area on one side of the third channel area may serve as a drain of a pull-down transistor corresponding to one first gate 130, and the third source area 17 located on the other side of the third channel area may serve as a drain of a pull-down transistor corresponding to the other first gate 130. The second source areas 15 of pull-down transistors corresponding to two different first gates 130 are located on a side of the extension portion away from the second gate 140. In some embodiments, two adjacent pull-down transistors corresponding to the same first gate 130 may also share the second source areas 15, so that the occupied area of the second active area 120 can be reduced, and thus the layout area of the word-line driver can be reduced.

It will be appreciated that Hot-Electron-Induced Punch-through (HEIP) will occur when two active areas of different doping types are adjacent. The HEIP is specifically as follows. When a circuit formed by the two active areas with different doping types is an analog circuit, the potentials may be different from each other, and when the potential difference between the two active areas is large enough, a depletion area of the active area may expand outward, so that a punch-through current is formed between the two active areas to generate electrical interference. Based on this, in some embodiments, the multiple first active areas 110 include at least two first active areas 110 arranged close to the NMOS area 11, two first active areas 110 are spaced apart along the first direction X and have a spaced area, and the second gate 140 directly faces the spaced area in the second direction Y. That is, the extension direction of the second gate 140 is the same as the extension direction of the spaced area, and the second gate 140 is located on an extension line of the spaced area. The second gate 140 is configured to cover the third channel area. That is, the third channel area directly faces the spaced area. The spaced area is configured to form an isolation structure between two first active areas 110 spaced apart. Therefore, the second gate 140 directly faces the isolation structure, so that the third channel area of the second source area 15 is not adjacent to the first channel area of the first source area, thereby improving the HEIP.

In the word-line driver provided by the above embodiments, the third source area 17 and the third drain area of the same holding transistor are respectively electrically connected to the second drain areas 16 of two different pull-down transistors. That is, the source and the drain of the same holding transistor are respectively connected to the drains of the two different pull-down transistors. Since the drains of two different pull-down transistors are also connected to two different sub word lines, one holding transistor 101 is configured to control the two sub word lines. The number of holding transistors in the word-line driver is greatly reduced, and thus the layout area of the word-line driver can be reduced, as compared to the case where one holding transistor is configured to control one sub word line.

Correspondingly, the embodiments of the disclosure also provide a storage device. The storage device includes: a storage unit array including multiple storage units connected to multiple sub word lines and multiple bit lines; and the word-line drive circuit provided in any of the above embodiments; or, the word-line driver provided in any of the above embodiments. In some embodiments, the storage units may be DRAM storage units.

It will be understood by those ordinarily skilled in the art that the above implementations are specific embodiments implementing the disclosure, and that various changes in form and details may be made in practical applications without departing from the spirit and scope of the disclosure. Various changes and modifications may be made by those skilled in the art without departing from the spirit and scope of the disclosure. Therefore, the protection scope of the disclosure is intended to be limited only by the scope of the appended claims.

The invention claimed is:

1. A word-line drive circuit, comprising:
   at least two sub word-line drivers (SWD), each of the SWDs being connected to a main word line (MWL) for providing an enable signal, and a sub word line, wherein
   the SWD comprises a holding transistor, a first end and a second end of the holding transistor are respectively connected to different sub word lines, and a gate of the holding transistor receives a second drive signal; and
   the SWD is configured to provide a first drive signal to a selected sub word line in response to the first drive signal and the enable signal, the selected sub word line being a sub word line connected to the first end or the second end of the holding transistor, and conduct the first end and the second end of the holding transistor in response to the first drive signal, the enable signal and the second drive signal;
   wherein the same MWL is connected to at least two SWDs, the same MWL corresponding to at least two sub word lines, and the two sub word lines connected to the first end and the second end of the holding transistor respectively correspond to the same MWL.

2. The word-line drive circuit according to claim 1, wherein the holding transistor comprises an N-type Metal Oxide Semiconductor (NMOS) transistor.

3. The word-line drive circuit according to claim 1, wherein the SWD comprises:
   a pull-up transistor, comprising a gate connected to the MWL, a source receiving the first drive signal, and a drain connected to the sub word line and the first end or the second end of the holding transistor; and
   a pull-down transistor, comprising a gate connected to the MWL, a drain connected to the drain of the pull-up transistor, and a source receiving a third drive signal.

4. The word-line drive circuit according to claim 3, wherein the pull-up transistor comprises a P-type Metal Oxide Semiconductor (PMOS) transistor, and the pull-down transistor comprises an NMOS transistor.

5. A word-line driver, comprising:
   a P-type Metal Oxide Semiconductor (PMOS) area, comprising multiple first active areas extending along a first direction, each first active area comprising a first channel area and a first source area and a first drain area respectively located at two opposite sides of the first channel area;
   an N-type Metal Oxide Semiconductor (NMOS) area arranged along a second direction with the PMOS area and comprising multiple second active areas extending along the first direction, each second active area comprising a second channel area and a second source area and a second drain area respectively located at two opposite sides of the second channel area, the second active area further comprising a third channel area and a third source area and a third drain area respectively located at two opposite sides of the third channel area;
   multiple first gates, each of the first gates extending along the second direction and covering the multiple first channel areas and the multiple second channel areas, the first gate being electrically connected to a main word line (MWL), the first gates, the first source areas and the first drain areas constituting pull-up transistors, and the first gates, the second source areas and the second drain areas constituting pull-down transistors; and
   multiple second gates, each of the second gates covering a corresponding third channel area, the second gates, the third source areas and the third drain areas constituting holding transistors,
   wherein a first drain area of one of the pull-up transistors is electrically connected to a second drain area of one of the pull-down transistors, and is electrically connected to a corresponding sub word line; and
   a third drain area of the same holding transistor is electrically connected to the second drain area of one of the pull-down transistors, and a third source area is electrically connected to a second drain area of another pull-down transistor;
   wherein the third channel area and at least one of the second channel areas belong to the same second active area;
   wherein a second drain area of one of the pull-down transistors corresponding to the same first gate is shared with a third drain area of a holding transistor, and a second drain area of another pull-down transistor corresponding to the same first gate is shared with a third source area of the holding transistor.

6. The word-line driver according to claim 5, wherein each of the first gates comprises:
   at least two extending portions spaced apart in the first direction, the extending portions extending along the second direction and covering the multiple first channel areas and the multiple second channel areas; and
   connection portions, connecting the extending portions arranged adjacently in the first direction.

7. The word-line driver according to claim 6, wherein the connection portions cover an area between the adjacent first active areas and further cover an area between the first active area and the second active area.

8. The word-line driver according to claim 6, wherein a distance between adjacent extension portions of the NMOS area is greater than a distance between adjacent extension portions of part of the PMOS area in the first direction, and each second gate is located between the adjacent extension portions.

9. The word-line driver according to claim 8, wherein the PMOS area comprises:
- a first PMOS area and a second PMOS area arranged along the second direction, the second PMOS area being located between the first PMOS area and the NMOS area,
- wherein two extension portions of the same first gate cover the same first active area of the first PMOS area, and the two extension portions further respectively cover two first active areas of the second PMOS area which are arranged along the first direction; and
- a distance between adjacent extension portions of the first PMOS area is less than a distance between adjacent extension portions of the second PMOS area in the first direction.

10. The word-line driver according to claim 6, wherein a distance between adjacent extension portions of the NMOS area is less than a distance between adjacent extension portions of part of the PMOS area in the first direction, and each second gate is located outside an area surrounded by two of the extension portions.

11. The word-line driver according to claim 8, wherein the PMOS area comprises:
- a first PMOS area and a second PMOS area arranged along the second direction, the second PMOS area being located between the first PMOS area and the NMOS area,
- wherein the two extension portions of the same first gate cover the same first active area of the second PMOS area, and the two extension portions further respectively cover two first active areas of the first PMOS area which are arranged along the first direction; and
- a distance between the adjacent extension portions of the first PMOS area is greater than a distance between the adjacent extension portions of the second PMOS area in the first direction.

12. The word-line driver according to claim 5, wherein each of the first gates covers 4×N first channel areas and 4×N second channel areas, and the pull-up transistors and the pull-down transistors constituted by each of the first gates are electrically connected to 2×N holding transistors, N being a positive integer greater than or equal to 1.

13. The word-line driver according to claim 5, wherein the multiple first active areas comprise: at least two first active areas arranged close to the NMOS area, two of the first active areas are spaced apart along the first direction and have a spaced area, and the second gate directly faces the spaced area in the second direction.

14. A storage device, comprising:
- a storage unit array comprising multiple storage units connected to multiple sub word lines and multiple bit lines; and
- the word-line drive circuit according to claim 1, or the word-line driver according to claim 5.

15. The storage device according to claim 14, wherein the storage units are Dynamic Random Access Memory (DRAM) storage units.

* * * * *